(12) United States Patent
Park et al.

(10) Patent No.: US 6,358,768 B1
(45) Date of Patent: Mar. 19, 2002

(54) METHOD FOR FABRICATING A SOLID-STATE IMAGE SENSOR HAVING AN HCCD AND VCCDS

(75) Inventors: Yong Park, Kyungki-do; Sang Ho Moon, Seoul, both of (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/466,190

(22) Filed: Dec. 17, 1999

Related U.S. Application Data

(62) Division of application No. 08/998,766, filed on Dec. 29, 1997, now Pat. No. 6,100,553.

(30) Foreign Application Priority Data

Jun. 5, 1997 (KR) .............................................. 97/23348

(51) Int. Cl.[7] .............................................. H01L 21/00
(52) U.S. Cl. ......................... 438/48; 438/75; 438/147
(58) Field of Search ........................... 257/231, 232, 257/233, 236, 238, 245, 248, 249, 462, 292, 414, 444; 438/48, 49, 75, 78, 79, 587, 57, 60, 147

(56) References Cited

U.S. PATENT DOCUMENTS

| | | | |
|---|---|---|---|
| 5,289,022 A | 2/1994 | Iizuka et al. | 257/232 |
| 5,406,101 A | 4/1995 | Park | 257/249 |
| 5,760,430 A | 6/1998 | Kato | 257/232 |
| 5,891,752 A * | 4/1999 | Losee | 438/75 |
| 5,895,944 A * | 4/1999 | Yamada | 257/233 |
| 6,114,717 A * | 9/2000 | Uchiya | 257/232 |

OTHER PUBLICATIONS

"A 1-Megapixel, Progressive-Scan Image Sensor With Antiblooming Control and Lag-Free Operation," IEEE Transactions on Electron Devices, vol. 38, No. 5, May 1991, pp. 981–988.

* cited by examiner

*Primary Examiner*—Olik Chaudhuri
*Assistant Examiner*—Hoai Pham
(74) *Attorney, Agent, or Firm*—Morgan, Lewis & Bockius LLP

(57) ABSTRACT

A solid-state image sensor and a fabricating method thereof in which poly gates in a horizontal charge coupled device (hereinafter referred to as HCCD) are made to have different lengths to omit a barrier ion implanting process step, thus simplifying the entire process and maximizing the charge-transferring efficiency are disclosed, the solid-state image sensor having an HCCD and VCCDs including a well region of a second conductivity type formed in a semiconductor substrate of a first conductivity type; a HCCD of the first conductivity type formed on the well region of the second conductivity type; and a plurality of polygate electrodes having sequentially different lengths repeatedly formed on the semiconductor substrate.

5 Claims, 5 Drawing Sheets

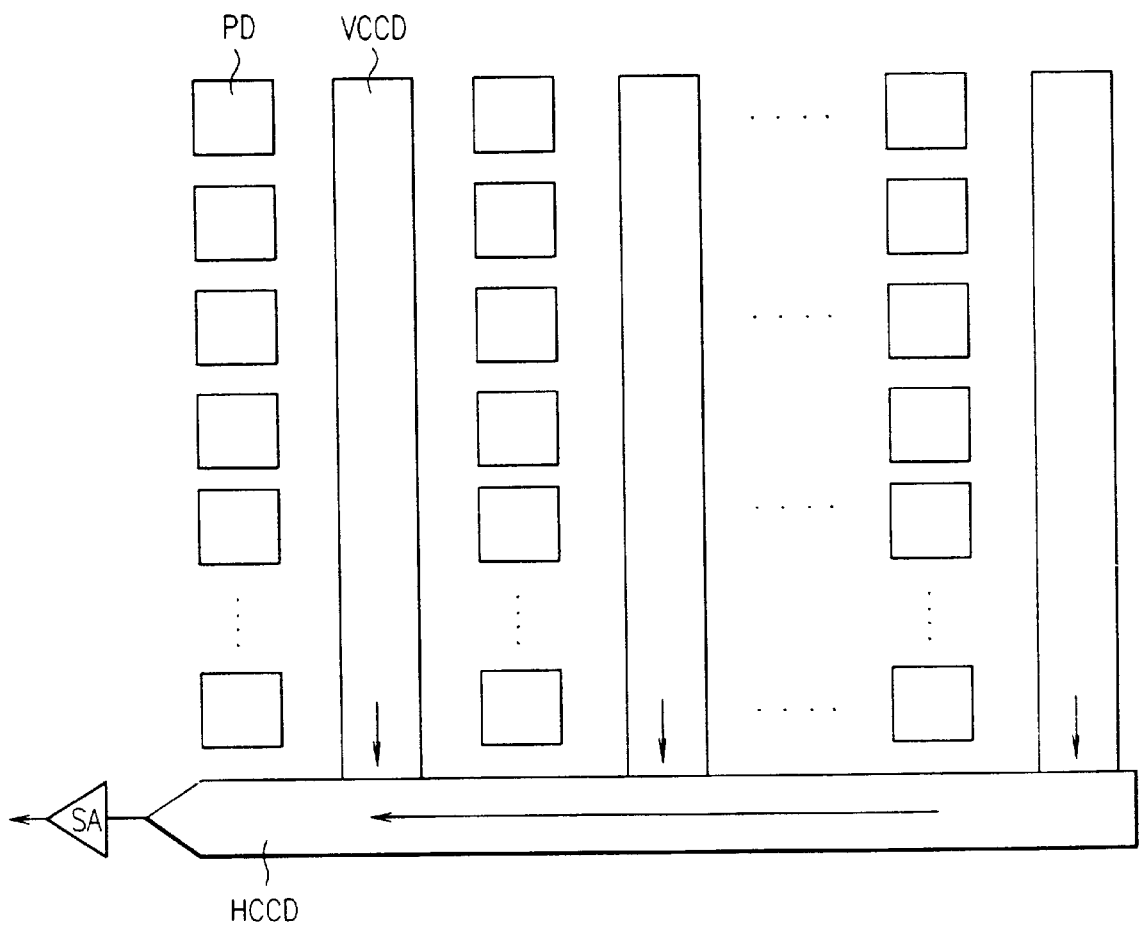

FIG.2B
prior art
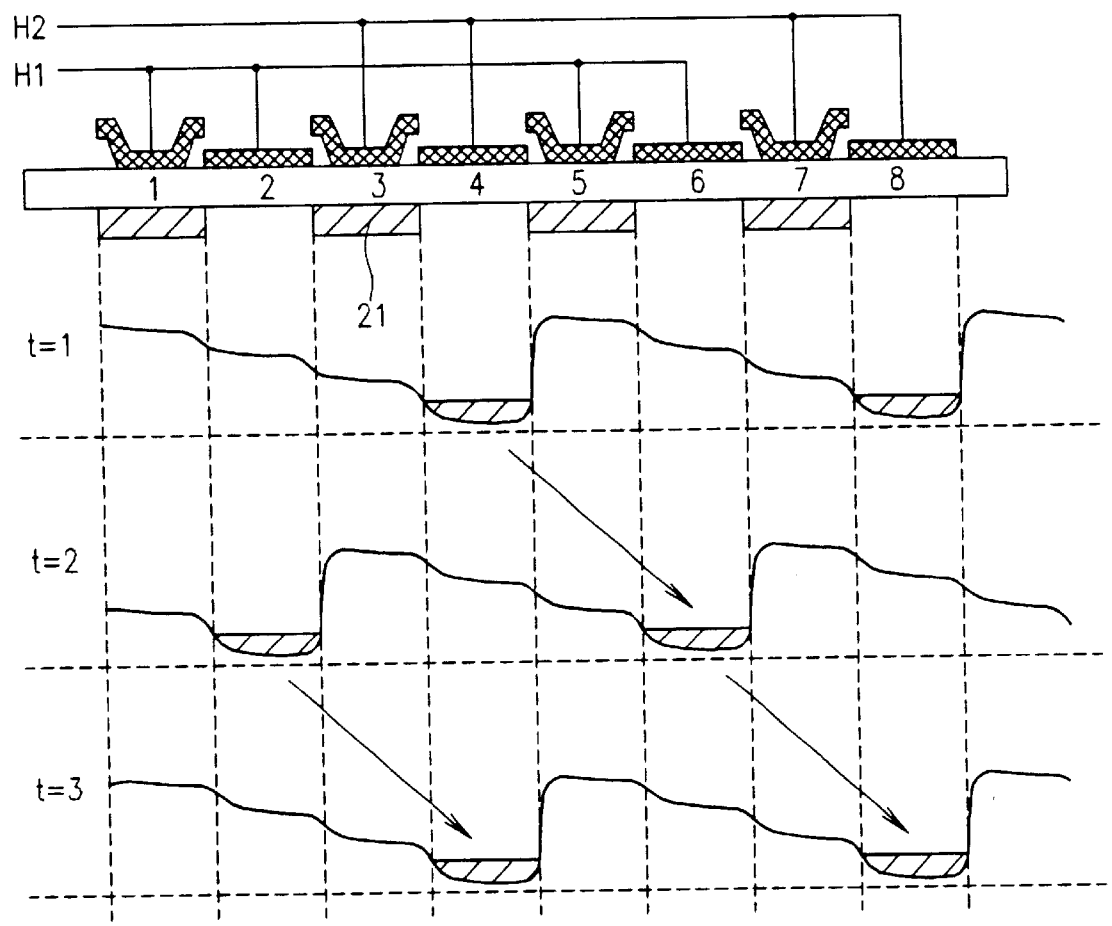
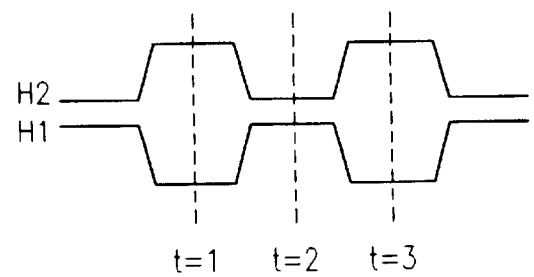

METHOD FOR FABRICATING A SOLID-STATE IMAGE SENSOR HAVING AN HCCD AND VCCDS

This is a divisional of Application No. 08/998,766 filed on Dec. 29, 1997, now U.S. Pat. No. 6,100,553.

BACKGROUND OF THE INVENTION

1. Field of the Invention

The present invention relates to a solid-state image sensor and, more particularly, to a solid-state image sensor and a fabricating method thereof in which poly gates in a horizontal charge coupled device (hereinafter referred to as HCCD) are made to have different lengths to omit a barrier ion implanting process step, thus simplifying the entire process and maximizing the charge-transferring efficiency.

2. Discussion of the Related Art

FIG. 1 is a layout of a general solid-state image sensor which includes a plurality of photo diode (PD) regions for converting a light signal into an electric signal charge, vertical charge coupled device (hereinafter referred to as VCCD) regions formed at right angle to the PD regions for transferring in a vertical direction the electric signal charge converted by the PD regions, a HCCD formed at right angle to the VCCDs for transferring in a horizontal direction the signal charge transferred from the VCCDs, and a sensing amplifier SA for sensing the signal charge transferred from the HCCD.

In such a solid-state image sensor having the aforementioned structure, since the HCCD must read charges in parallel transferred from VCCDs in a very short time the corresponding, clocking should be carried out Accordingly, a 2-phase clocking is carried out on average in an HCCD unlike VCCDs in which a 4-phase clocking is carried out.

A conventional HCCD will be described with reference to the accompanying drawings. FIG. 2A is a cross-sectional view of a conventional HCCD and FIG. 2B is a potential profile of a conventional HCCD.

As shown in FIG. 2A, a HCCD includes a p-type well 13 formed on an N-type semiconductor substrate 11, a buried charge coupled device (hereinafter referred to as BCCD) 15 formed on a predetermined area of the p-type well 13, a gate insulating layer 17 formed on the BCCD 15, first and second polygate electrodes 19 and 19a formed alternately and insulatively on the gate insulating layer 17, and buried regions 21 formed under the second polygate electrodes 19a for potential difference between the second polygate electrodes 19a and the BCCD 15. At this time, a gate insulating layer 17a is formed between the first and second polygate electrodes 19 and 19a.

In this HCCD, with potential wells maintained in a form of stairs as shown in FIG. 2B, charges are moved in a specific direction. To describe in more details, when t=1, charges gather at the bottom of the potential well of a fourth polygate electrode which a high voltage is applied to. When t=2, a high voltage is applied to the first and second polygate electrodes, whereby energy levels at the bottoms of the first and second polygate electrodes decrease; and a low voltage is applied to the third and fourth polygate electrodes, whereby energy levels at their bottoms rise. However, electrons which gather at the bottom of the fourth polygate electrode can not move left because of a barrier region 21 under the third polygate electrode. As energy levels of fifth and sixth polygate electrodes decrease gradually such that a right energy barrier of the fifth polygate electrode is removed, charges moved toward the bottom of the fifth and sixth polygate electrodes having low energy levels. If the energy levels of the fifth and sixth polygate electrodes become high enough, potential walls having a form of stairs are formed such that the electrons-gathering position turns from the bottom of the fourth polygate electrode to that of the eighth polygate electrode. As previously described, potential levels change sequentially by using the conventional 2-phase clocking, thereby moving signal charges toward the sensing amplifier.

However, such a conventional solid-state image sensor has the following problems. Since the potential difference is achieved after formation of a first polygate electrode, an ion-implanting process step is performed with the first polygate electrode serving as a mask. Further, since another process step is necessary for forming a second polygate electrode, the entire process is very complex.

SUMMERY OF THE INVENTION

Therefore, the present invention is directed to a solid-state image sensor and a fabricating method thereof that substantially obviate one or more of problems due to limitations and disadvantages of the related art.

An object of the invention is to provide a solid-state image sensor and a fabricating method thereof in which, instead of performing an ion-implanting process for generating the potential difference, polygate electrodes having different lengths are formed to generate the necessary potential difference, thus simplifying the entire process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a solid-state image sensor having an HCCD and VCCDs includes a well region of a second conductivity type formed in a semiconductor substrate of a first conductivity type; a HCCD of the first conductivity type formed on the well region; and a plurality of polygate electrodes having sequentially different lengths repeatedly formed on the semiconductor substrate.

In another aspect of the present invention, a method for fabricating a solid-state image sensor having an HCCD and VCCDs includes the steps of forming a well region of a second conductivity type formed on a semiconductor substrate of a first conductivity type; forming a HCCD of the first conductivity type on the well region; forming a gate insulating layer on the HCCD and then a polysilicon layer on the gate insualting layer; and patterning the polysilicon layer to form a plurality of polygate electrodes having lengths decreasing toward a charge-moving direction.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIG. 1 is a layout of a general solid-state image sensor;

FIG. 2B is a potential profile of a conventional solid-state image sensor;

DETAILED DESCRIPTION OF THE PREFERRED EMBODIMENTS

Reference will now be made in detail to the preferred embodiments of the present invention, examples of which are illustrated in the accompanying drawings.

Since polygate electrodes in an HCCD are patterned to have different lengths, sizes of charge packets are varied according to lengths of the patterns of the polygate electrodes.

Figure 2A:
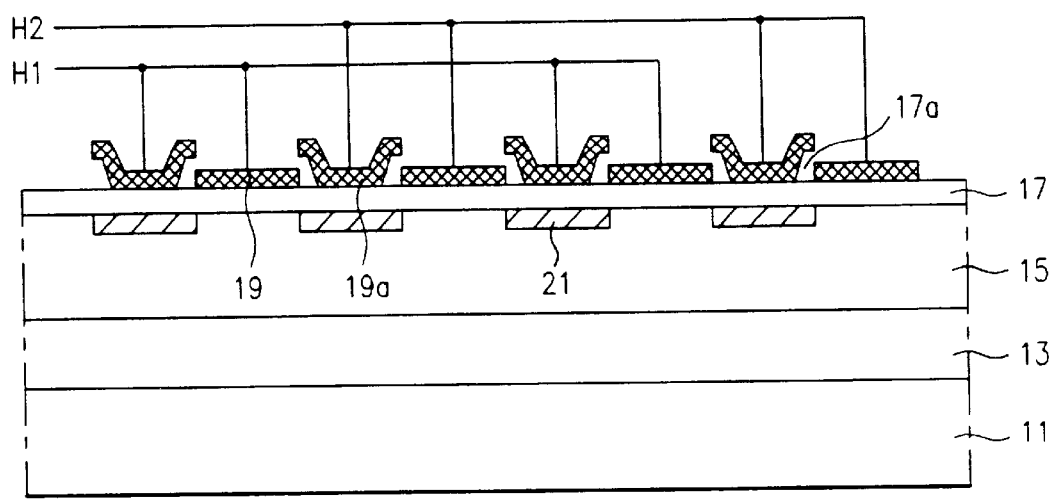
FIG. 2A is a cross-sectional view of a conventional solidstate image sensor.
Figure 3:
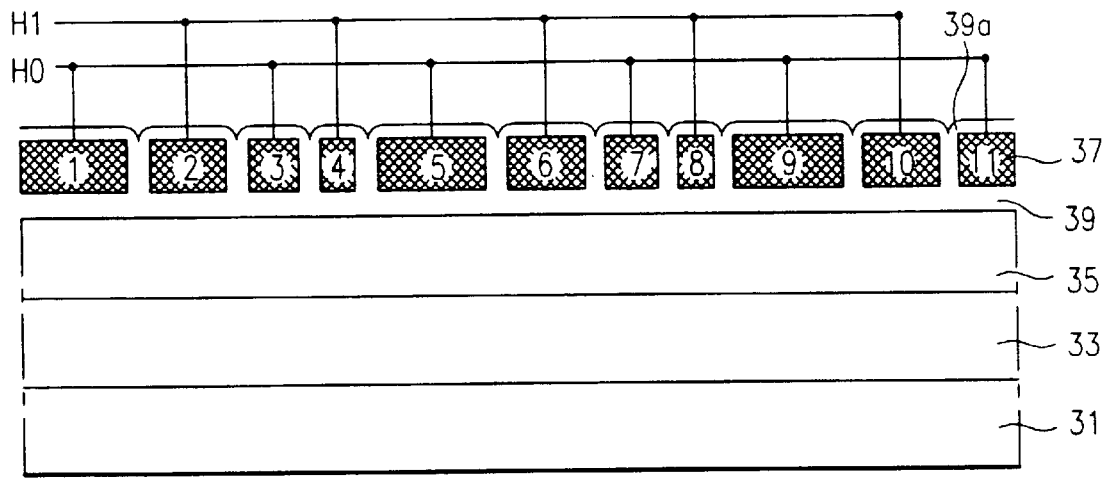
FIG. 3 is a cross-sectional view showing a structure of a solid-state image sensor according to the present invention.

FIG. 3 is a cross-sectional view of a solid-state image sensor which, according to the present invention, includes a semiconductor substrate 31 of a first conductivity type, a well region 33 of a second conductivity type formed in the semiconductor substrate 31, a HCCD 35 on the well region of the second conductivity type, and a plurality of polygate electrodes 37 formed on the HCCD 35 for having sequentially different lengths. In this case, the first conductivity type is an n-type and the second conductivity type is a p-type.

A gate insulating layer 39 insulates the HCCD 35 from the polygate electrodes 37 and an insulating layer 39a insulates the polygate electrodes 37 from one another. An identical clock is applied to the polygate electrodes 37 having the same size among a plurality of polygate electrodes 37. An identical clock is applied to the alternate polygate electrodes 37.

The polygate electrodes 37 have 4 sequentially different lengths that are "a", which is a standard value, "a+1", "a+2", and "a+3". These 4 polygate electrodes 37 having the lengths of "a", "a+1", "a+2", and "a+3", respectively are arranged repeatedly. That is, as shown in FIG. 3, a clock signal of H0 is applied to the first, third, fifth, and seventh polygate electrodes et al, while a clock signal of H1 is applied to the second, fourth, sixth, and eighth polygate electrodes et al.

Figure 4:
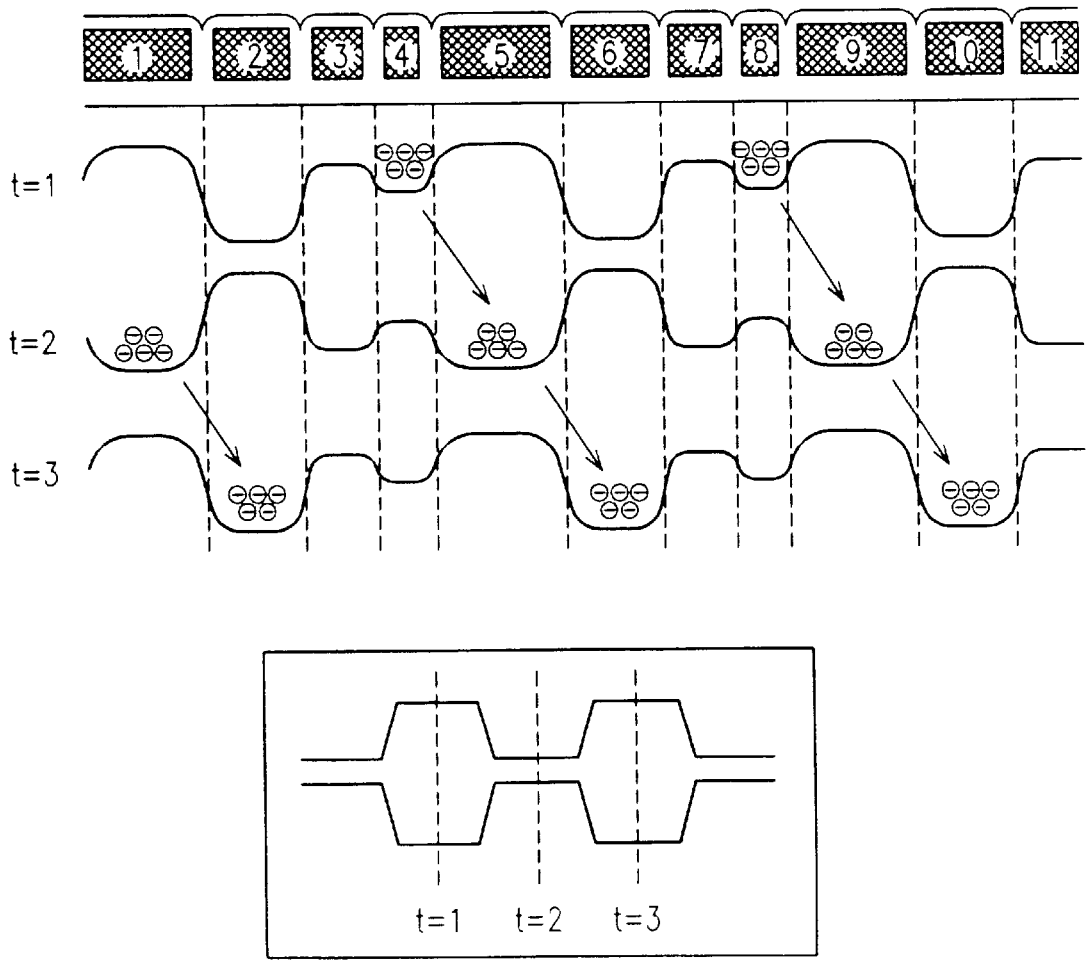
FIG. 4 is a potential profile of a solid-state image sensor according to the present invention.

The operation of the aforementioned HCCD will be described with reference to FIG. 4 that is a potential profile of the HCCD according to the present invention. Signal charges optically converted in PD regions are transferred to the HCCD through VCCDs. At this time, as shown in FIG. 4, when t=1, the clock signal of H0 becomes low, while the clock signal of H1 becomes high. Accordingly, whereas a low voltage is applied to the first, third, fifth, and seventh polygate electrodes, a high voltage is applied to the second, fourth, sixth, and eighth polygate electrodes. Even though an identical voltage is applied to the first, third, fifth, and seventh polygate electrodes, there are differences between the generated charge packet sizes as a result of the length differences between the polygate electrodes.

The relations between the lengths of the polygate electrodes and the charge packet sizes will be described. The charge packet sizes are proportionate to areas of polygate electrodes when impurity ions are implanted uniformly. That is, the bigger the polygate electrode areas become, the bigger the charge packet sizes become. Also, the capacitance increases in proportion to the charge packet sizes. Accordingly, since the capacitance is proportionate to the charge packet size, a channel potential changes according to an area of gate.

In this way, using the relations between an area of a polygate electrode and the corresponding charge packet size, potential levels corresponding to the second, fourth, sixth, and eighth polygate electrodes vary according to the sizes of the polygate electrodes.

That is, when t=1, a low voltage is applied to the first polygate electrode, which then has a high energy well; a high voltage is applied to the second polygate electrode, which then has a deep potential well (that is, a big charge packet size). Though an identical voltage is applied to both the first polygate electrode and the third polygate electrode, the third polygate electrode has a smaller energy well than the first polygate electrode because it has a shorter length than the first polygate electrode.

Though an identical voltage is applied to the second polygate electrode and the fourth polygate electrode, the fourth polygate electrode has a smaller charge packet size than the second polygate electrode because it has a shorter length. Accordingly, signal charges transferred from the VCCDs gather at the bottoms of the fourth and eighth polygate electrodes as shown in FIG. 4. Thereafter, when t=2, a clock signal of a high voltage is applied to the first, third, fifth, and seventh polygate electrodes and a clock signal of a low voltage is applied to the second, fourth, sixth, and eighth polygate electrodes. In other words, share a high voltage is applied to the first polygate electrode, a big charge packet size is formed there. On the other hand, the second polygate electrode becomes to have a relatively high energy well.

Though an identical voltage is applied to the first polygate electrode and the third polygate electrode, the third polygate electrode has a smaller charge packet size than the first polygate electrode because it has a shorter length than the first polygate electrode.

Though an identical voltage is applied to the second polygate electrode and the fourth polygate electrode, the fourth polygate electrode has a smaller energy well than the second polygate electrode because it has a shorter length than the second polygate electrode.

Also, since a high voltage is applied to the fifth polygate electrode, the fifth polygate electrode has a bigger charge packet size than the fourth polygate electrode. Thus, when t=2, charges gathered at the bottom of the fourth polygate electrode when t=1, move to the bottom of the fifth polygate electrode.

When t=3, the charges gathering at the bottom of the first and fifth polygate electrodes move to the bottoms of the second and sixth polygate electrodes, respectively. As previously described, when a clock signal is applied to polygate electrodes having different lengths, charges move.

A method for fabricating a solid-state image sensor having the aforementioned structure will be described with reference to FIGS. 5A to 5C that are cross-sectional views showing its process steps.

Figure 5A:
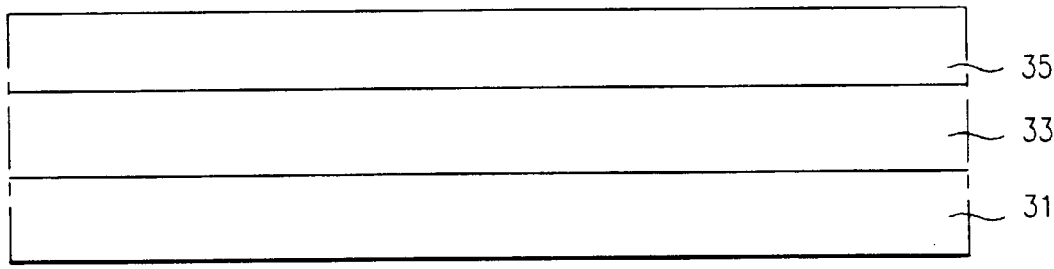
FIGS. 5A to 5C are cross-sectional views showing process steps of a method for fabricating a solid-state image sensor according to a preferred embodiment of the present invention.

Referring initially to FIG. 5A, a well region 33 of a second conductivity type is formed in a semiconductor substrate 31 of a first conductivity type. At this time, the first conductivity type is an n-type and the second one is a p-type.

Next, a HCCD 35 is formed on the well region 33 of the second conductivity type.

Figure 5B:
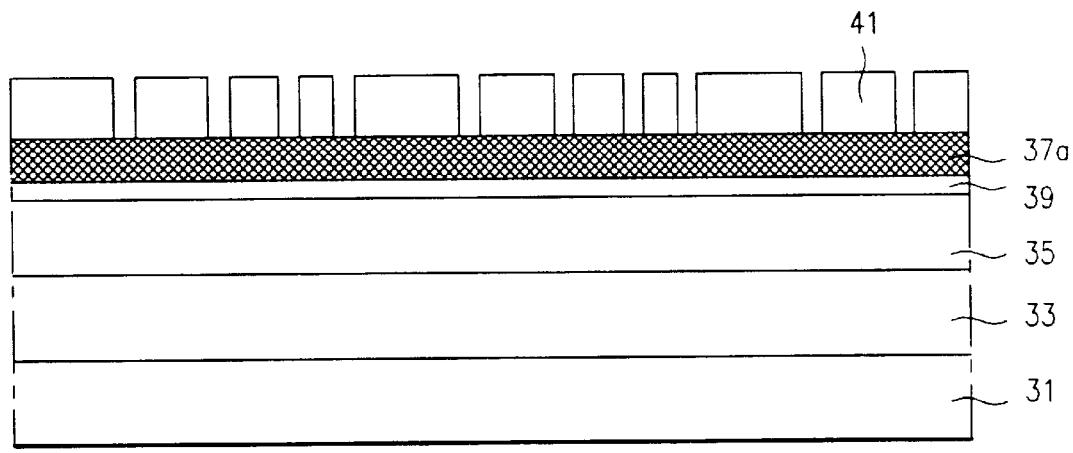

Referring to FIG. 5B, a gate insulating layer 39 is formed on the HCCD 35. Next, a polysilicon layer 37a for polygate electrodes is formed on the gate insulating layer 39. A photoresist film 41 is deposited on the polysilicon layer 37a and then is subjected to an exposure and development process to have different widths that decrease sequentially toward a charge-moving direction.

Figure 5C:
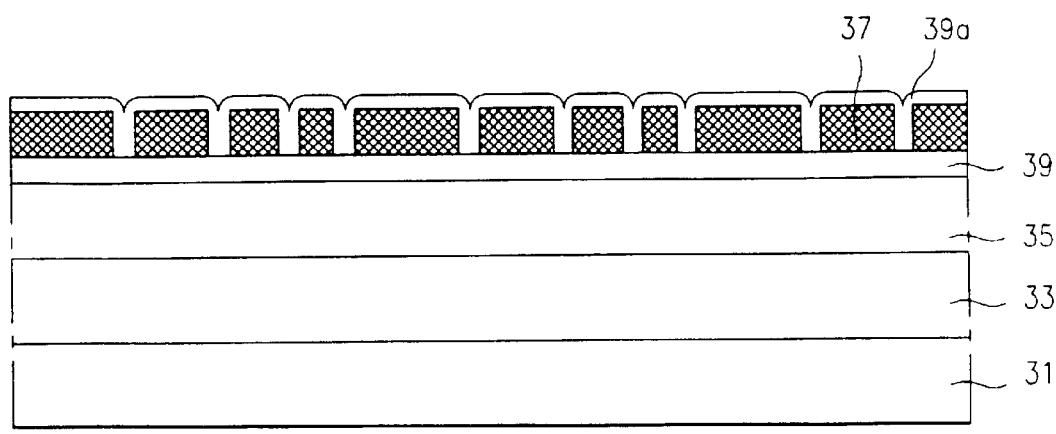

Referring to FIG. 5C, with the photoresist pattern 41 serving as a mask, the polysilicon layer 37a is selectively etched to form a plurality of polygate electrodes 37 having different widths. In this case, the polygate electrodes 37 have lengths that decrease in a charge moving direction. And a group of 4 polygate electrodes 37 are formed repeatedly.

Since lengths of the polygate electrodes 37 are sequentially different in a charge-moving direction, the corresponding charge packet sizes vary according to the lengths of the polygate electrodes 37, so are the corresponding potential levels. Then, signal charges, transferred from the VCCDs by varying potential levels according to the lengths of the polygate electrodes 37, are transferred to a sensing amplifier SA through the VCCDs.

Such a solid-state image sensor of the present invention has the following advantages. Since a plurality of polygate electrodes are formed in one process step, the entire process is simplified. Further, since the polygate electrodes are formed to have different lengths so as to generate potential differences, an ion-implanting process for generating potential differences is not necessary, thereby simplifying the entire process. Furthermore, since each of the polygate electrodes has an identical thickness and feature, charge-transferring efficiency is maximized.

It will be apparent to those skilled in the art that various modification and variations can be made in the solid-state image sensor and the fabricating method thereof of the present invention without departing from the spirit or scope of the inventions. Thus, it is intended that the present invention cover the modifications and variations of this invention provided they come within the scope of the appended claims and their equivalents.

What is claimed is:

1. A method for fabricating a solid-state image sensor having an HCCD and VCCDs, comprising the steps of:

forming a well region of a second conductivity type formed in a semiconductor substrate of a first conductivity type;

forming a HCCD of the same conductivity type as the semiconductor substrate on the well region;

forming a gate insulating layer on the HCCD and then a polysilicon layer on the gate insualting layer; and patterning the polysilicon layer to form a plurality of polygate electrodes having lengths which sequentially decrease in a charge-moving direction.

2. The method as claimed in claim 1, wherein the polysilicon layer is patterned so that groups each of which four polygate electrodes constitute are arranged repeatedly.

3. The method as claimed in claim 1, wherein an identical clock signal is applied to one of the polygate electrodes and the polygate electrode next to the polygate electrode next to the one of the polygate electrodes.

4. The method as claimed in claim 1, wherein the semiconductor substrate and the HCCD are of an n type and the well region is of a p-type.

5. The method as claimed in claim 1, after forming the plurality of polygate electrodes, further comprising the step of:

forming an insulating layer for insulating the polygate electrodes from one another.

* * * * *